(12) United States Patent
Lee et al.

(10) Patent No.: US 10,680,080 B2
(45) Date of Patent: Jun. 9, 2020

(54) SEMICONDUCTOR DEVICE AND METHOD FOR MANUFACTURING THE SAME

(71) Applicant: Magnachip Semiconductor, Ltd., Cheongju-si (KR)

(72) Inventors: Tae Hoon Lee, Sejong-si (KR); Jun Hee Cho, Cheongju-si (KR); Jin Seong Chung, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/162,962

(22) Filed: Oct. 17, 2018

(65) Prior Publication Data

US 2019/0386117 A1   Dec. 19, 2019

(30) Foreign Application Priority Data

Jun. 14, 2018  (KR) .......................... 10-2018-0068367

(51) Int. Cl.
*H01L 29/66* (2006.01)
*H01L 29/78* (2006.01)
(Continued)

(52) U.S. Cl.
CPC .... *H01L 29/66659* (2013.01); *H01L 29/0634* (2013.01); *H01L 29/0847* (2013.01);
(Continued)

(58) Field of Classification Search
CPC ............................................... H01L 29/66674
(Continued)

(56) References Cited

U.S. PATENT DOCUMENTS 6,900,101 B2 *  5/2005  Lin ................... H01L 29/66689
                                                          257/E21.345
7,138,690 B2   11/2006  Xie et al.
(Continued)

FOREIGN PATENT DOCUMENTS

| JP | 10-200111 A | 7/1998 |
|---|---|---|
| KR | 10-2015-0099666 A | 9/2015 |
| WO | WO 2012/071299 A | 5/2012 |

OTHER PUBLICATIONS

Korean Office Action dated May 31, 2019 in counterpart Korean Patent Application No. 10-2018-008367 (13 pages, in Korean with English translation).

*Primary Examiner* — David Vu
*Assistant Examiner* — Brandon C Fox
(74) *Attorney, Agent, or Firm* — NSIP Law

(57) ABSTRACT

A method for manufacturing a semiconductor device includes forming a gate insulation film and a polysilicon layer on a substrate, forming a polysilicon pattern by etching the polysilicon layer, forming an opening in the polysilicon pattern that exposes a part of the polysilicon pattern by forming a mask pattern on the polysilicon pattern, forming a gate electrode by etching the part of the polysilicon pattern exposed through the opening, forming a P-type body region by ion implanting a P-type dopant onto the substrate using the gate electrode as a mask, forming an N-type LDD region on the P-type body region by ion implanting an N-type dopant onto the substrate using the gate electrode as a mask, forming a spacer on a side surface of the gate electrode, and forming an N-type source region on a side surface of the spacer.

20 Claims, 14 Drawing Sheets

(51) Int. Cl.
  *H01L 29/417* (2006.01)
  *H01L 29/10* (2006.01)
  *H01L 29/06* (2006.01)
  *H01L 29/08* (2006.01)

(52) U.S. Cl.
  CPC ...... *H01L 29/1083* (2013.01); *H01L 29/4175* (2013.01); *H01L 29/7835* (2013.01)

(58) Field of Classification Search
  USPC .......................................... 257/343; 438/275
  See application file for complete search history.

(56) References Cited

U.S. PATENT DOCUMENTS

| | | |
|---|---|---|
| 8,664,718 B2 | 3/2014 | Cheng et al. |
| 2009/0273028 A1* | 11/2009 | Mallikarjunaswamy ................... H01L 21/26513 257/335 |
| 2009/0283827 A1* | 11/2009 | Pendharkar ....... H01L 21/26513 257/343 |
| 2011/0272758 A1* | 11/2011 | Banerjee ............ H01L 23/5252 257/328 |
| 2013/0277741 A1 | 10/2013 | Guowei et al. |
| 2013/0320443 A1* | 12/2013 | Levin ................... H01L 27/088 257/337 |
| 2014/0070315 A1* | 3/2014 | Levy .................. H01L 29/0634 257/343 |
| 2015/0084126 A1* | 3/2015 | Jung ................. H01L 21/26586 257/339 |
| 2018/0061981 A1* | 3/2018 | Zhou ................. H01L 29/66681 |

\* cited by examiner

SEMICONDUCTOR DEVICE AND METHOD FOR MANUFACTURING THE SAME

CROSS-REFERENCE TO RELATED APPLICATIONS

This application claims the benefit under 35 USC 119(a) of Korean Patent Application No. 10-2018-0068367 filed on Jun. 14, 2018 in the Korean Intellectual Property Office, the entire disclosure of which is incorporated herein by reference for all purposes.

BACKGROUND

1. Field

The following description relates to a semiconductor device and a method for manufacturing the same. The following description also relates to an n-LDMOS device and a method for manufacturing the same.

2. Description of Related Art

Metal-oxide-semiconductor field effect transistor (MOSFET) devices having a high switching frequency and a low power loss have been widely used in power conversion and power control circuits. In such examples, there exist various types of power MOSFET devices that are known as double-diffused MOS (DMOS) transistors. For example, there exist a vertical double-diffused metal-oxide-semiconductor (VDMOS) device that is a vertical type DMOS and a lateral double-diffused metal-oxide-semiconductor (LDMOS) device that is a lateral type DMOS.

Such an LDMOS is widely used as a switch for control, logic, and power applications. It is required that such an LDMOS has not only a high breakdown voltage (BV) to endure a high voltage applied thereto, but also a low on-resistance to minimize a conduction loss.

In the LDMOS, a body region is formed to form a channel region. Furthermore, a gate electrode is formed on the body region of the LDMOS. In this example, the body region of the LDMOS is formed using a body mask pattern, and the gate electrode is formed using a gate electrode mask pattern. A channel length of the LDMOS is adjusted by the body mask pattern and the gate electrode mask pattern. Because the channel length is adjusted by the two mask patterns, channel width dispersion occurs. As the channel width dispersion is reduced, threshold voltage dispersion is also reduced. However, because two masks are used, dispersion of a photolithography process increases. Accordingly, dispersions of the channel and the threshold voltage differ from each other. As described above, because the channel length is determined by two mask patterns rather than one mask pattern, there occurs an issue that the respective dispersions of the channel and the threshold voltage each become greater.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for manufacturing a semiconductor device, includes forming a gate insulation film and a polysilicon layer on a substrate, forming a polysilicon pattern by etching the polysilicon layer, forming an opening in the polysilicon pattern that exposes a part of the polysilicon pattern by forming a mask pattern on the polysilicon pattern, forming a gate electrode by etching the part of the polysilicon pattern exposed through the opening, forming a P-type body region by ion implanting a P-type dopant onto the substrate using the gate electrode as a mask, forming an N-type LDD region on the P-type body region by ion implanting an N-type dopant onto the substrate using the gate electrode as a mask, forming a spacer on a side surface of the gate electrode, and forming an N-type source region on a side surface of the spacer.

The P-type body region may include a plurality of body ion implantation regions.

The P-type body region may be formed by tilted ion implantation using the gate electrode as a mask.

The P-type body region may be formed to overlap with the gate electrode.

The P-type body region may have a longer width as it becomes closer to a top surface of the substrate.

The forming the gate electrode may include forming a first gate electrode and a second gate electrode spaced apart from each other.

The preparing the substrate may include forming an N-type buried layer, a P-type buried layer, and an N-type drift region, forming a P-type well region connected to the P-type buried layer, and forming an N-type well region connected to the N-type buried layer.

The N-type buried layer may have a length that is greater than a length of the P-type buried layer.

The gate electrode may be formed of polysilicon, tungsten (W), tungsten nitride (WN), titanium (Ti), molybdenum (Mo), cobalt (Co), nickel (Ni), copper (Cu), or aluminum (Al).

The gate insulation film may be formed of any one or any combination of any two or more of silicon oxide film ($SiO_2$) or a silicon nitride film (SiN), a silicon oxide nitride film (SiON), and a high-k material film.

The high-k material film may include any one or any combination of any two or more of aluminum oxide ($Al_2O_3$), tantalum oxide ($Ta_2O_5$), and hafnium oxide ($HfO_2$).

In another general aspect, a method for manufacturing a semiconductor device includes forming a gate insulation film and a polysilicon layer on a substrate, forming a mask pattern on the polysilicon layer, performing an ion-implantation process, using a P-type dopant, onto the substrate, that implants dopant that passes through the polysilicon layer, forming a gate electrode by etching the polysilicon layer using the mask pattern, forming a P-type body region on the substrate that overlaps the gate electrode by performing secondary ion implantation onto the substrate, using the gate electrode as a mask, forming an N-type LDD region on the P-type body region, using the gate electrode as a mask, forming a spacer on the gate electrode, and forming an N-type source region on the P-type body region.

The method may further include forming an N-type drain region spaced apart from the gate electrode.

The method may further include forming a P-type buried layer that contacts the P-type body region before forming the gate insulation film and the polysilicon layer on the substrate.

In another general aspect, a semiconductor device includes a first conductivity type buried layer formed on a substrate, a second conductivity type buried layer formed on the first conductivity type buried layer and having a width that is less than a width of the first conductivity type buried layer, first conductivity type first and second drift regions formed on the second conductivity type buried layer, first and second gate electrodes formed on the first and second drift regions, respectively, a second conductivity type body region disposed between the first and second drift regions and connected to the second conductivity type buried layer, and a first conductivity type source region disposed between the first and second drift regions and formed on the second conductivity type body region.

The semiconductor device may further include first and second drain regions of the first conductivity type formed spaced apart from the first and second gate electrode, respectively.

The body region may include a plurality of body ion implantation regions having different depths.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
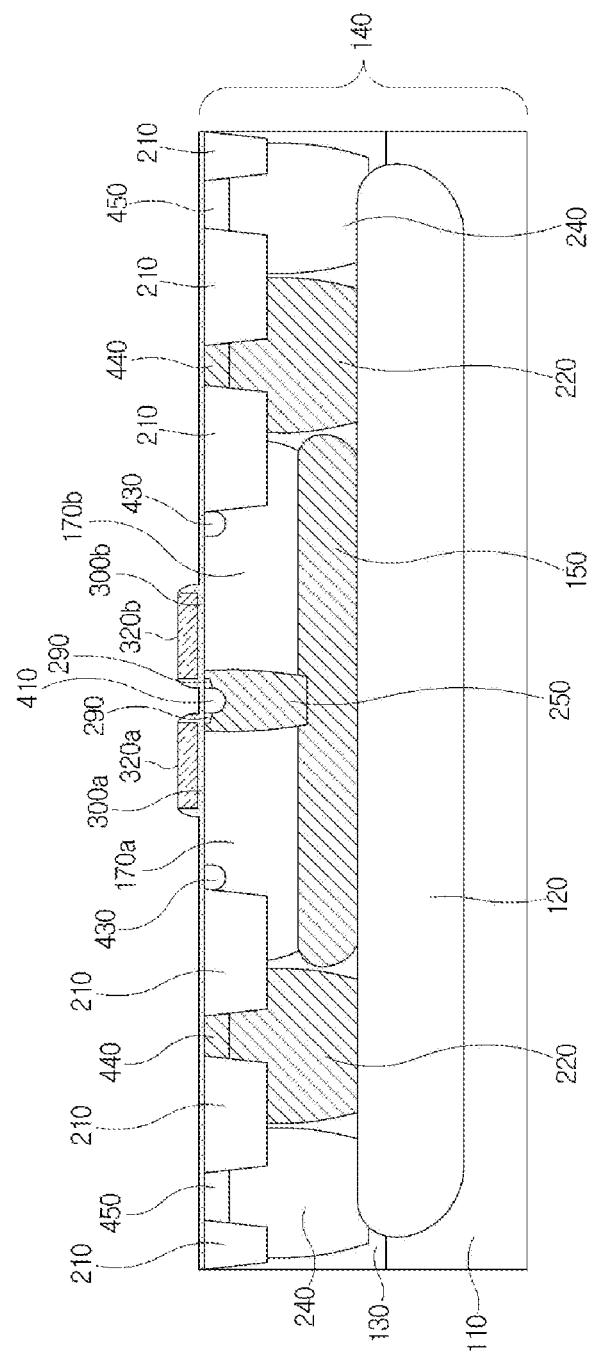
FIG. 1 is a view illustrating a semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Hereinafter, preferred embodiments of the present disclosure will be described in detail with reference to the accompanying drawings so that one of ordinary skill in the art can easily embody the present disclosure. The present disclosure may be implemented in various different types, and is not limited to the embodiments described hereinafter.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

In the entire description of the present disclosure, for easy understanding thereof, portions that are not related to the description will be omitted, and the same drawing reference numerals are used for the same elements across various figures.

The aspects and features of the present disclosure and methods for achieving the aspects and features will be apparent by referring to the embodiments to be described in detail with reference to the accompanying drawings. However, the present disclosure is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the disclosure, and the present disclosure is only defined within the scope of the appended claims. In the entire description of the present disclosure, the same drawing reference numerals are used for the same elements across various figures.

Further, exemplary embodiments of the present disclosure described in the description will be described with reference to cross-sectional views and/or plan views that are ideal exemplary views of the present disclosure. In the drawings, thicknesses of films and regions are exaggerated for effective explanation of the technical contents. Accordingly, the shapes of the exemplary views may be modified due to manufacturing technology and/or permitted errors. Accordingly, the exemplary embodiments of the present disclosure is not limited to the specific shapes as illustrated, but may include shape changes created in accordance with the manufacturing process. For example, an etched region illustrated at right angles may be rounded or may have a specific curvature. Accordingly, regions exemplarily illustrated in the drawings have schematic attributes, and the shapes of the regions exemplarily illustrated in the drawings are to exemplify the specific shapes of the regions of the device, but are not to limit the scope of the present disclosure.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

According to the aspects of the present examples, the characteristic dispersion due to the overlay dispersion of the photolithography process may be reduced, and a design for forming the LDMOS channel may be minimized to reduce the chip size.

An aspect of the present examples is to provide a method for forming a channel of an n-LDMOS device with one mask pattern rather than two mask patterns.

Another aspect of the present examples is to provide a semiconductor device and a method for manufacturing the same, which may form a channel region on a lower portion of a gate electrode by implanting an impurity with an incident angle that is inclined at a specific angle.

Another aspect of the present examples is to provide a semiconductor device and a method for manufacturing the same that may form a body region using a gate electrode as a mask to solve issues with dispersions of a threshold voltage and a breakdown voltage due to dispersion occurring during a photolithography process.

FIG. 1 is a view illustrating a semiconductor device according to an example.

Referring to the example of FIG. 1, a semiconductor device may include a P-type substrate 110, an N-type buried layer (NBL) 120, a P-type epi-layer (P-epi layer) 130, a P-type buried layer (PBL) 150, first and second N-drift regions 170a and 170b, a trench isolation region (STI) 210, a P-type well region (PW region) 220, an N-type well region (NW region) 240, a P-type body region (P-body region) 250, an N-LDD region 290, gate insulation films 300a and 300b, gate electrodes 320a and 320b, an N+ source region 410, an N+ drain region 430, and a P+ contact region 440. In such an example, the N-type may be called a first conductivity type, and the P-type may be called a second conductivity type. For example, an N-type buried layer may be called a first conductivity type buried layer, and a P-type buried layer may be called a second conductivity type buried layer. The remaining regions are referred to in a similar manner.

A substrate 140 includes the P-type substrate 110 and the P-type epi-layer 130. An N-type epi-layer may be used in lieu of the P-type epi-layer 120. The NBL 120 and the PBL 150 may also be successively disposed in the substrate 140. For example, the NBL 120 may be a layer doped with a high-concentration N-type impurity, and the PBL 150 may be a layer doped with a high-concentration P-type impurity. Such an NBL 120 may be used for a fully isolated MOS device in a high-voltage device. Because the NBL 120 and the NW 240 are electrically connected to one another and fully surround an N-LDMOS device 100, the NBL 120 and the NW 240 serve to electrically isolate the N-LDMOS device 100 from other devices. Thus, the NBL 120 and the NW 240 serve as a type of guard rings. In an example, only two symmetric n-LDMOS devices are illustrated as being present around a common source region 410. However, in other examples, two or more n-LDMOS devices may be arranged in a line in the form of an array. Because the NBL 120 is disposed in the substrate 110, noise of the high-voltage device may be reduced accordingly. Furthermore, leakage current of the n-LDMOS device 100 may be reduced as well. The PBL 150 is formed so as to have a length that is smaller than the length of the NBL 120. The length of the PBL 150 may refer to a spatial distance extending from the PBL 150 in a direction that is vertical with respect to the direction toward the NBL 120.

Because the PBL 150 doped with the P-type impurity is disposed below the first and second N-drift regions 170a and 170b, it helps to increase the concentration of the N-drift regions 170a and 170b, which provides desirable properties. For example, if the concentration of the N-drift regions 170a and 170b is increased, the resistance of the N-drift regions 170a and 170b may be reduced during a turn-on state of the N-LDMOS device 100. Further, a depletion region can be extended by the PBL 150 in a turn-off state of the N-LDMOS device 100, and accordingly a desired breakdown voltage may be obtained.

The N-drift regions 170a and 170b and the P-body region 250 may be disposed on the PBL 150. For example, the N-drift regions 170a and 170b may be regions doped with an N-type impurity, and the P-body region 250 may be a region doped with a P-type impurity. However, if the doping concentration of the N-drift regions 170a and 170b is low, the breakdown voltage of the N-LDMOS device 100 is increased. Thus, the P-body region 250 may be a channel region doped with the P-type impurity at low concentrations. For example, the P-body region 250 may be a region on which a channel is formed between a source and a drain. The P-body region 250 comes into physical contact with the PBL 150 so as to be electrically connected to the PBL 150. Furthermore, the PBL 150 comes into physical contact with the PW region 220 to be electrically connected to the PW region 220. In such an example, if the PW region 220 does not exist, leakage current may occur between the NW region 240 and the N-drift regions 170a and 170b, which may cause operational issues. Furthermore, the PW region 220 may be used to apply a bias current to the PBL 150 below the N-drift regions 170a and 170b.

The N-drift regions 170a and 170b and the PBL 150 may be ion-implanted using the same mask, and may also have similar lengths in a lateral direction. However, the PBL 150 may alternatively be formed to be longer than the lateral length of the N-drift regions 170a and 170b, in another example.

A field oxide film or a device isolation film 210 may be provided on the substrate 140. The field oxide film or the device isolation film 210 may be provided in the form of a trench for insulation between adjacent devices. For example, the device isolation film 210 may be an oxide film that acts to isolate neighboring devices from one another.

The gate electrodes 320a and 320b may be disposed on the N-drift regions 170a and 170b and the P-body region 250. In such an example, the gate electrodes 320a and 320b may be formed of a conductive material or a metal layer. As the conductive material, polysilicon (poly-Si) may be used. As the metal layer, tungsten (W), tungsten nitride (WN), titanium (Ti), molybdenum (Mo), cobalt (Co), nickel (Ni), copper (Cu), or aluminum (Al) may be used. However, these are only example materials and other similar materials with similar properties may be used as the conductive material or the metal layer in other examples. The gate insulation films 300a and 300b may be disposed between the gate electrodes 320a and 320b, the N-drift regions 170a and 170b, and the P-body region 250. In an example, the gate insulation films 300a and 300b may be made of a silicon oxide film ($SiO_2$) or a silicon nitride film (SiN), a silicon oxide nitride film (SiON), or a high-k material, where a high-k material refers to a material with a high dielectric constant. The high-k material, such as aluminum oxide ($Al_2O_3$), tantalum oxide ($Ta_2O_5$), and hafnium oxide ($HfO_2$), may be formed singly or in combination, or alternatively formed by stacking a first high-k material and a second high-k material.

The N+ drain region 430 may be provided on the N-drift regions 170a and 170b. For example, the N+ drain region 430 may be a region doped with an N-type impurity. For example, the N+ drain region 430 is formed to be spaced apart from the gate electrode at predetermined intervals to increase the withstanding voltage of the N-LDMOS 100. The withstanding voltage may be increased accordingly as the N+ drain region goes further away from the gate electrode. In such an example, a separate device isolation film does not exist on the N-drift regions 170a and 170b disposed between the N+ drain region 430 and the gate electrodes 320a and 320b. Also, the substrate 140 between the N+ drain region 430 and the gate electrodes 320a and 320b has a coplanar structure.

The N-LDD region 290 and the N+ source region 410 may be provided on the P-body region 250. For example, the N-LDD region 290 and the N+ source region 410 may be regions doped with an N-type impurity. A channel region is formed in the P-body region 250 disposed between the N-LDD region 290 and the gate electrodes 320a and 320b. Additionally, on the P-body region 250, a second conductivity type pickup region disposed adjacent to the N+ source region 410 may be provided. For example, the second conductivity type pickup region may be a region doped with a P-type impurity.

FIGS. 2 to 10 are views illustrating a method for forming a semiconductor device according to an example.

Figure 2:
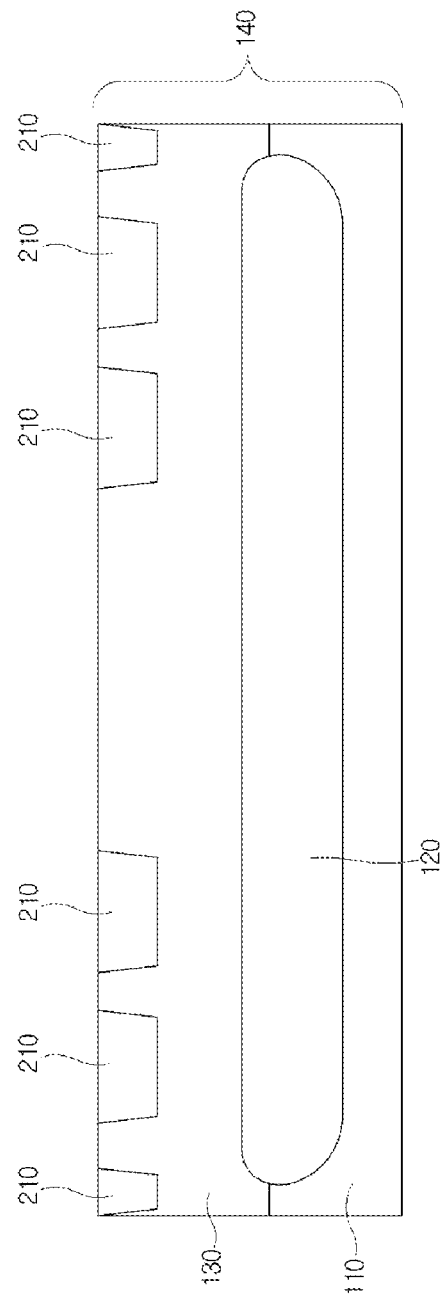
FIGS. 2 to 10 are views illustrating a method for forming a semiconductor device according to an example.

Referring to the example of FIG. 2, an NBL 120 is formed on a P-type substrate 110. The NBL 120 is formed by ion implanting an N-type dopant and subsequently performing annealing. Furthermore, a isolation region 210 is formed on the surface of a P-epi layer 130 after growing the P-epi layer 130. For example, the isolation region 210 may be formed using shallow trench isolation (STI), medium trench isolation (MTI), deep trench isolation (DTI), and local oxidation of silicon (LOCOS) structures. Furthermore, an STI+DTI structure in which the STI structure and the DTI structure are combined with each other may be formed. Furthermore, a LOCOS+DTI structure in which the LOCOS structure and the DTI structure are combined with each other may be formed. Furthermore, an MTI+DTI structure in which the MTI structure and the DTI structure are combined with each other may be formed. Thus, various combinations of STI, MTI, DTI, and LOCOS structures are used in the isolation region 210 to achieve various effects.

Figure 3:
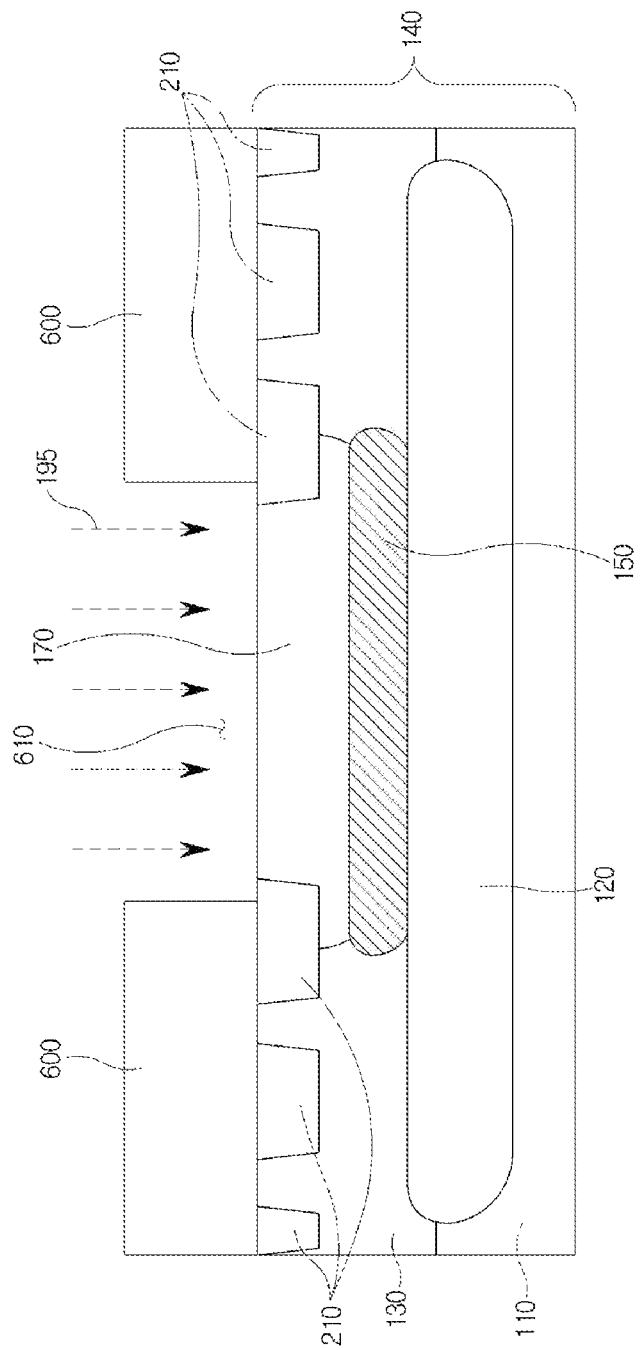

Referring to the example of FIG. 3, a PBL 150 and an N-drift region 170 are successively formed using an N-drift mask pattern 600. A first opening 610 for opening the substrate 140 is formed by using the N-drift mask pattern 600. Using the first opening 160 space, ion implantation 195 for forming the PBL and the N-drift region is performed. For example, the PBL 150 may be formed by implanting a high-concentration P-type impurity. Furthermore, high-energy ion implantation is required to form the PBL 150. For example, the P-type impurity may include Boron (B) ions, though this is only one example of a P-type impurity and other examples may use other appropriate P-type impurities. The N-drift region 170 may be a drift region doped with an N-type impurity. The N-drift region 170 and the PBL 150 are ion-implanted using the same mask 600, and thus the N-drift region 170 and the PBL 150 have similar lengths extending in the lateral direction of the substrate 140. However, because the PBL 150 is formed through a deeper ion implantation than that of the N-drift region 170, the PBL 150 may be alternatively formed to have a lateral length that is longer than the lateral length of the N-drift region 170a. After the PBL 150 and the N-drift region 170 are formed, the N-drift mask 600 is subsequently removed.

Figure 4:
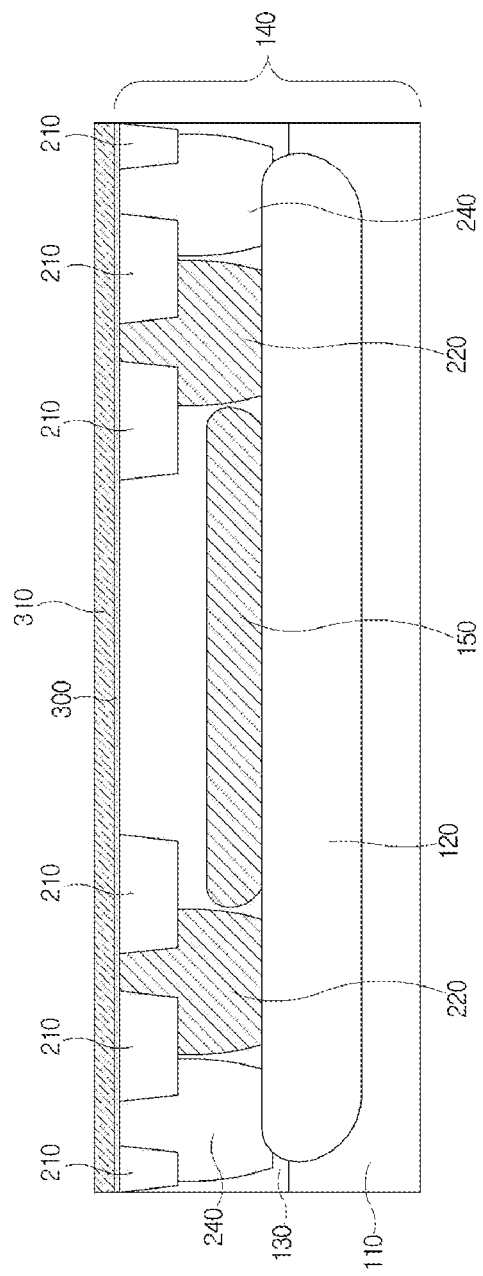

Referring to the example of FIG. 4, an NW region 240 and a PW region 220 are formed on the substrate 140. The PBL region 150 comes into physical contact with the PW region 220, and thus may be electrically connected to the PW region 220. According to the example of FIG. 4, if the PW region 220 does not exist, leakage current may occur between the NW region 240 and the N-drift region 170. Furthermore, the PW region 220 may be used to apply a bias to the PBL 150 below the N-drift region 170. Thus, the NW region 240 and the NBL 120 come into contact with each other and are electrically connected to each other to thereby form the shape of a guard ring. The NW region 240 and the NBL 120 may accordingly separate the N-LDMOS device 100 from other devices. By using a continuous formation technique, a gate insulation film 300 and a polysilicon 310 may be formed on the N-drift region 170. The gate insulation film 300 may be made of a silicon oxide film (SiO2), a silicon nitride film (SiN), or a silicon oxide nitride film SiON or high-K material, such as a hafnium oxide layer, a tantalum oxide layer, or an aluminum oxide layer. However, these are only example materials, and other appropriate materials are used in other examples to form the gate insulation film 300.

Figure 5:
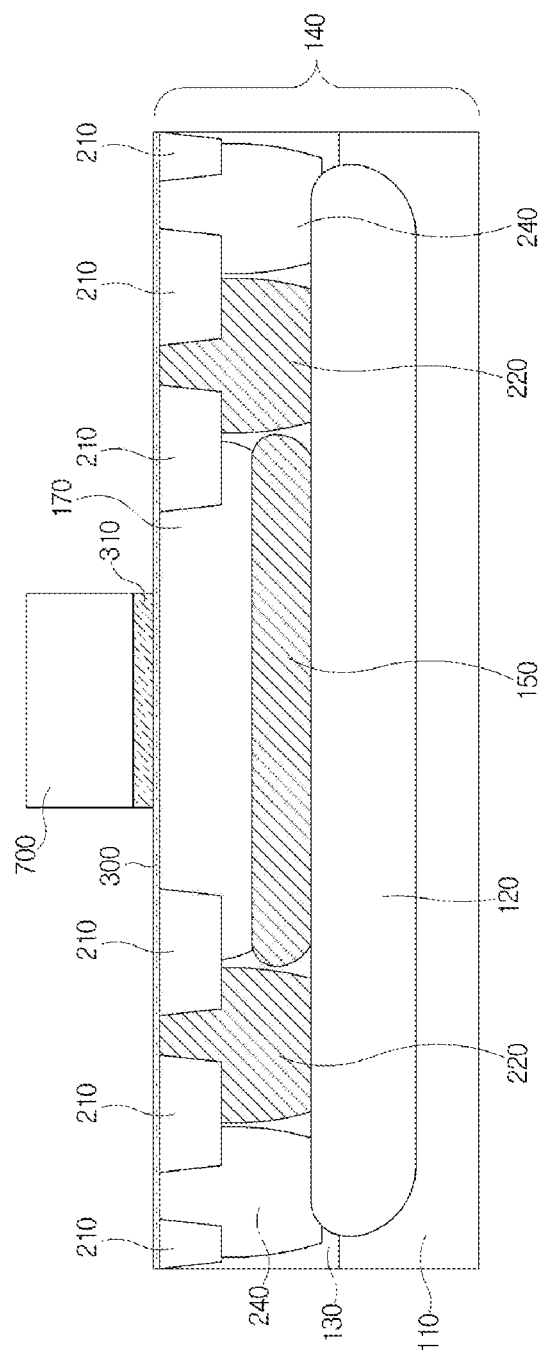

Referring to the example of FIG. 5, a gate mask pattern 700 may be formed on the polysilicon 310. A polysilicon pattern 310 is formed by etching the polysilicon 310 using the gate mask pattern 700. As the polysilicon pattern 310 is formed, the gate insulation film 300 may be exposed, and thus a part of the gate insulation film 300 may be etched accordingly. In a spacer forming process, the gate insulation film 300 exposed onto the substrate 140 may all be removed.

Figure 6:
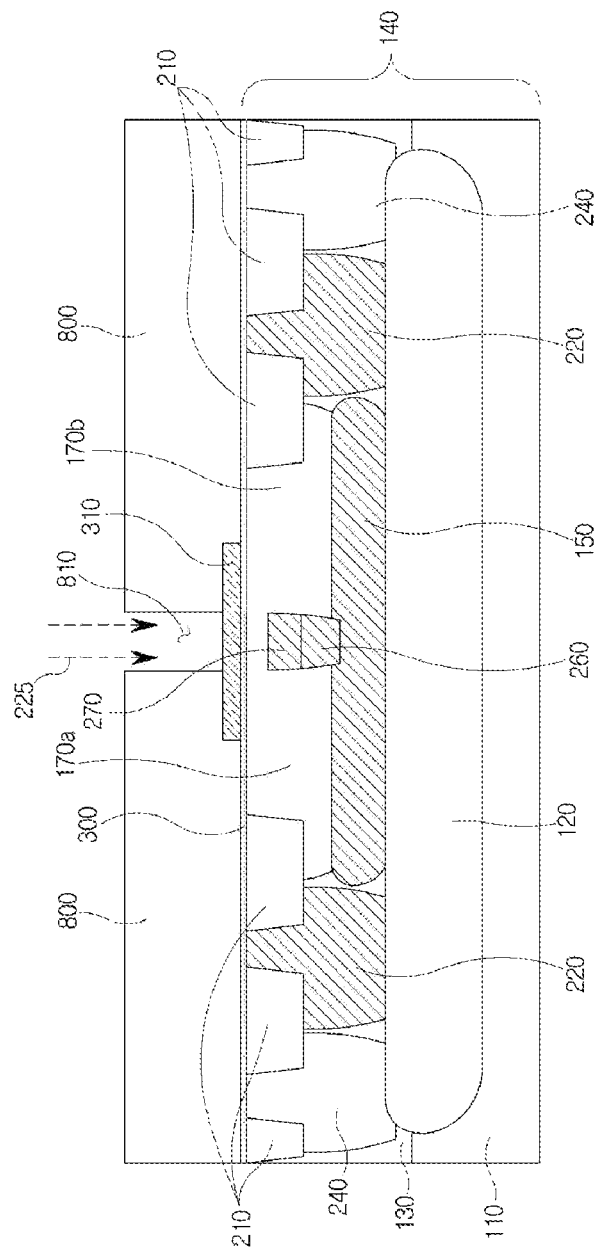

Referring to the example of FIG. 6, a P-body mask pattern 800 is formed on the gate insulation film 300 and the polysilicon pattern 310 so as to expose a part of the polysilicon pattern 310. A second opening 810 is formed by the P-body mask pattern 800. Through the second opening 810, the polysilicon pattern 310 is exposed. Ion implantation 225 is performed into the second opening 810 at this point. For example, a P-type impurity may be ion-implanted onto the substrate 140 through passing through the exposed polysilicon pattern 310. If the P-type impurity is implanted using a high ion implantation energy, the P-type impurity arrives at the substrate after passing through the polysilicon pattern 310. Accordingly, a first body ion implantation region 260 may be formed on the N-drift region 170 below the polysilicon pattern 310. Using a continuous approach, a second body ion implantation region 270 may be formed on the N-drift region 170 through secondary ion implantation of the P-type impurity using medium ion implantation energy. The first body ion implantation region 260 and the second body ion implantation region 270 are formed on the N-drift region 170 in the form of a stack structure. As described above, a plurality of P-type body ion implantation regions may be formed using different ion implantation energies. For example, the P-type impurity may be implanted into the N-drift region 170 through two ion implantation processes. In such an example, as the first body ion implantation region 260 and the second body ion implantation region 270 are formed, the N-drift region 170 may be divided accordingly into a first N-drift region 170a and a second N-drift region 170b.

Figure 7:
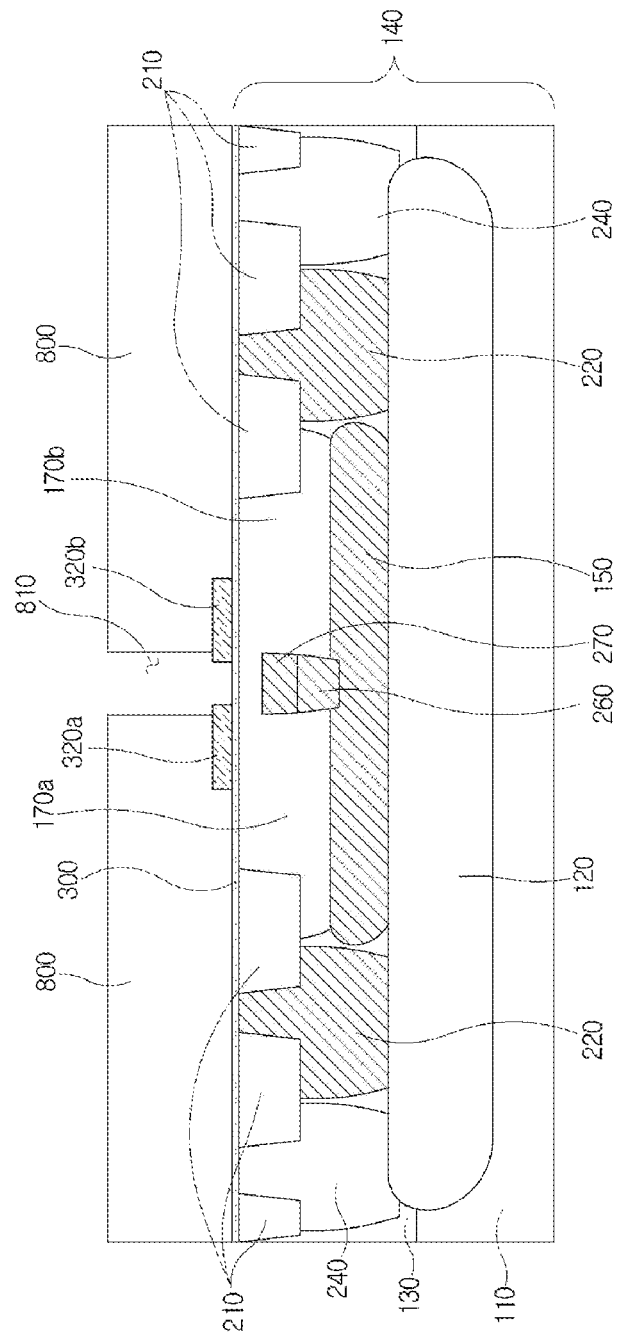

Referring to the example of FIG. 7, a first gate electrode 320a and a second gate electrode 320b are formed by etching a center region of the exposed polysilicon pattern 310 in a state in which the P-body mask pattern 800 exists. The etched polysilicon pattern 310 may be a portion vertically overlapping the first and second body ion implantation regions 260 and 270. As the polysilicon pattern 310 is etched, the gate insulation film 300 is exposed as well. Furthermore, either a part or the entirety of the gate insulation film 300 may be etched in accordance with an etching rate. If the entirety of the gate insulation film 300 is etched, parts of the first and second N-drift regions 170a and 170b may be exposed accordingly. In such an example, the first and second gate electrodes 320a and 320b become the gate electrodes of the n-LDMOS device 100.

Figure 8:
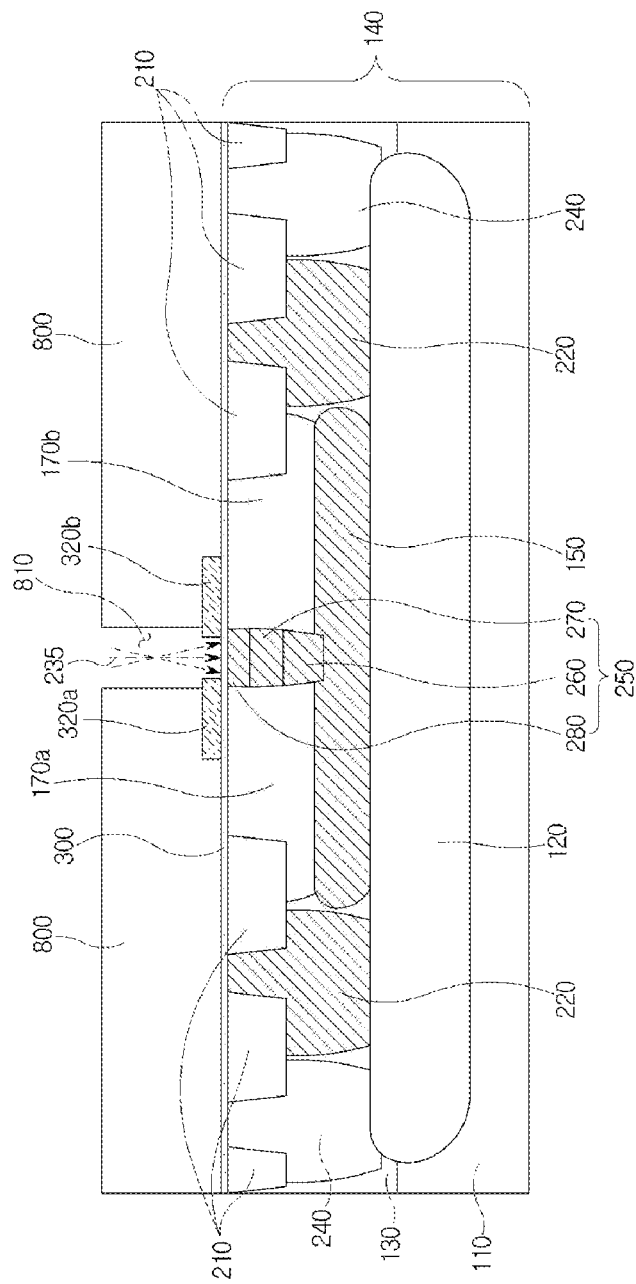

Referring to the example of FIG. 8, the P-type impurity is ion-implanted 235 for a third time into the substrate 140 between the first gate electrode 320a and the second gate electrode 320b using the opening 810. That is, a third body ion implantation region 280 is formed by performing a third ion implantation onto the first and second N-drift regions 170a and 170b. The third body ion implantation region 280 is formed using the first and second gate electrodes 320a and 320b as a mask. The P-body mask pattern 800 acts to prevent the third body ion implantation region 280 from being formed at other locations.

In such an example, the P-type impurity may be implanted into the first and second N-drift regions 170a and 170b at a tilted angle corresponding to a specific angle θ against the sidewalls of the gate electrodes. The tilted angle at which the P-type impurity is implanted may be an acute angle as measured based on the sidewalls of the gate electrodes. Through this, the P-type impurity may be implanted into lower portions of the first and second gate electrodes 320a and 320b. After the ion implantation of the P-type impurity occurs, a high-temperature annealing process may be performed for subsequent diffusion or activation of the P-type impurity.

The length of the third body ion implantation region extending toward the lower portions of the gate electrodes 320a and 320b may be controlled by controlling the tilted angle at which the P-type impurity is implanted and the concentration of the P-type impurity. That is, the length of the third body ion implantation region extending to the lower portions of the gate electrodes 320a and 320b may be controlled in accordance with the tilted angle at which the P-type impurity is implanted and the concentration of the P-type impurity. Therefore, a process of forming a channel having a length suitable to the desired size of the semiconductor device may be easily performed. As described above, the P-body region is formed in a self-aligned manner using the gate electrodes 320a and 320b as a mask. Accordingly, an overlay issue does not occur during the formation of the P-body region. In such an example, the overlay issue refers to a difference occurring between the gate mask pattern 700 used for forming the gate electrodes 320a and 320b and the P-body mask pattern 800 used for forming the P-body region 250. As shown in the example of FIG. 8, because the P-body region 250 is formed using the gate electrodes 320a and 320b as a mask, the overlay issue disappears and may be avoided.

The P-body region 250 may be formed through a combination of the first and second body ion implantation regions 260 and 270 and the third body ion implantation region 280. In such an example, the third body ion implantation region 280 has a lateral length that is longer than a lateral length of the first and second body ion implantation regions 260 and 270. This longer lateral length occurs because the first and second body ion implantation regions 260 and 270 are ion-implanted in a vertical direction, whereas the third body ion implantation region 280 is tilt ion-implanted. For example, the P-type impurity may be directly implanted into the lower portions of the gate electrodes 320a and 320b using the tilt ion implantation. However, the depth of the third body ion implantation region 280 may be thinner and shallower than the depth of the first and second body ion implantation regions 260 and 270, also due to the use of tilt ion implantation. Furthermore, in such an example, the first and second body ion implantation regions 260 and 270 and the third body ion implantation region 280 exist between the first and second gate electrodes 320a and 320b. Also, in such an example, the P-body region 250 is disposed between the first and second N-drift regions 170a and 170b.

Figure 9:
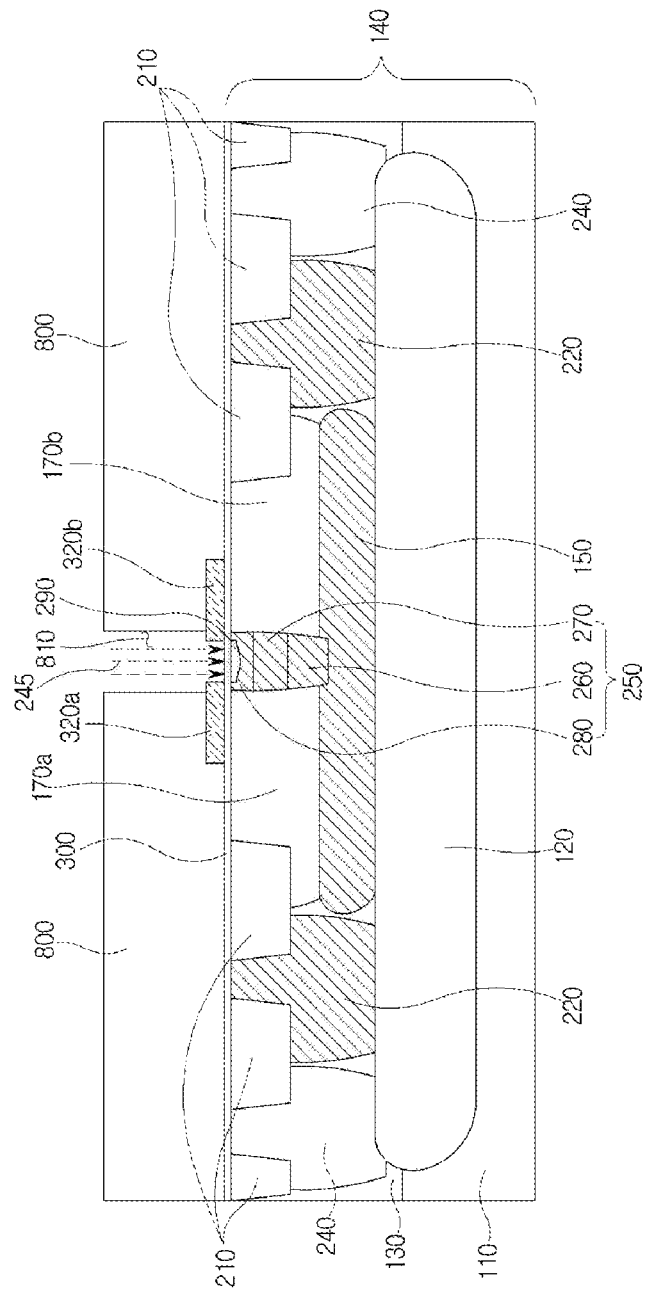

Referring to the example of FIG. 9, an N-LDD region 290 may be formed by implanting an N-type impurity into the third body ion implantation region 280. LDD ion implantation 245 is ion implantation that uses the gate electrodes 320a and 320b as a mask. Because the N-LDD region is formed on the P-type body region 250, the length of a channel region is determined in this stage. In the present examples, the P-type body region and the N-LDD region are formed using the gate electrodes as a mask. As a result, this approach means that the channel length is determined using the same gate electrode mask for such formation. Through this technique, an overlay issue does not occur. This example shows the same effect as that achieved by entering into no photolithography process.

In such an example, the LDD ion implantation 245 may ion-implant the dopant in a vertical direction without tilting. By performing such a diffusion process, the N-LDD region 290 may be formed so as to overlap the gate electrodes 320a and 320b. The length measured from one edge of the N-LDD region 290 to one edge of the third body ion implantation region 280 may be referred to as the channel length. That is, one edge of the N-LDD region 290 may denote the edge portion of the N-LDD region 290 in a direction toward the gate electrodes 320a and 320b. In such an example, the lateral length of the N-LDD region 290 is shorter than the lateral length of the third body ion implantation region 280.

Figure 10:
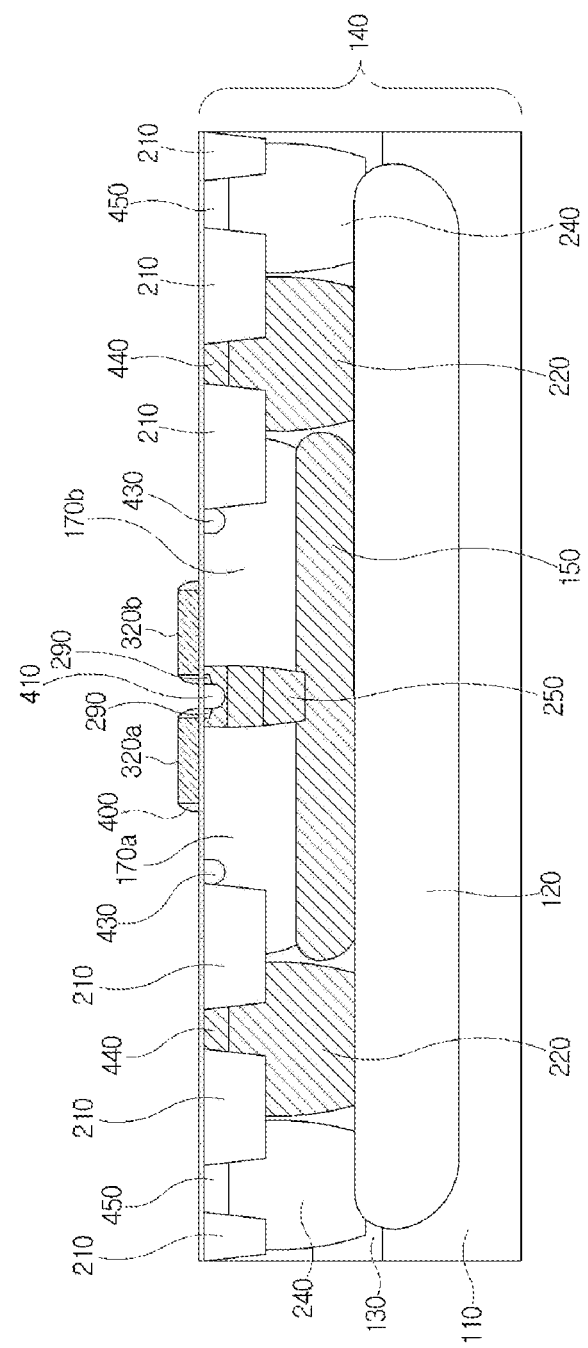

Referring to the example of FIG. 10, a spacer insulation film 400 is formed on side surfaces of the gate electrodes 320a and 320b. Furthermore, using an N+ mask, an N+ source region 410 and an N+ drain region are formed. As described above, the N+ source region 410 is formed so as to overlap the N-LDD region 290. The N-LDD region 290 acts as a link between the gate electrodes 320a and 320b and the N+ source region. Furthermore, an N+ region 450 is formed on the NW region 240. Additionally, a P+ contact region 440 is formed on the PW region 220 using a P+ mask. The P+ contact region 440 is also formed on the P-body region 250 in order to apply a bias to the P-body region 250.

After the source region 410 and the drain region 430 are formed, a silicide layer may be formed on the substrate 140 and the gate electrodes 320a and 320b. Furthermore, contact plugs may be formed to connect an interconnect line and the silicide layer to each other. Accordingly, the N-LDMOS 100 may be formed in this manner.

FIGS. 11A to 11D are views illustrating a method for forming a semiconductor device according to another example. This method of the examples of FIGS. 11A to 11D is related to a method for forming first and second body ion implantation regions 260 and 270 and a third body ion implantation region 280 on an N-drift region 170.

Figure 11A:
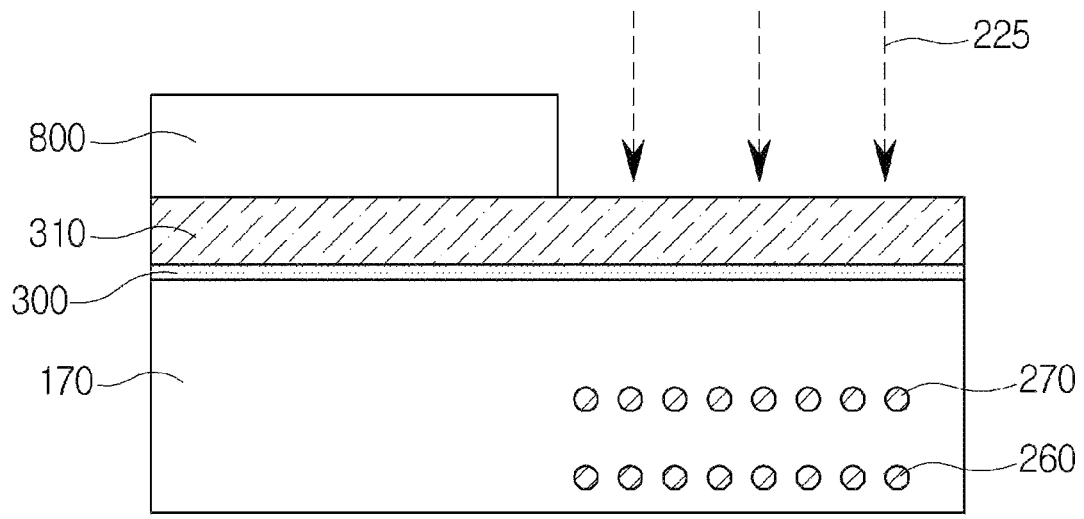
FIGS. 11A to 11D are views illustrating a method for forming a semiconductor device according to another example.

Referring to the example of FIG. 11A, a P-body mask pattern 800 is formed in a state where a polysilicon layer 310 has been formed. Furthermore, while using different ion implantation energies, first and second body ion implantation processes 225 are successively performed on the N-drift region 170 through P-type ion implantation, a shown in the example of FIG. 11A. Because ions are implanted so as to pass through the polysilicon layer 310, first and second body ion implantation regions 260 and 270 are accordingly formed on a lower portion of the polysilicon layer. However, the first body ion implantation region 260 requires larger ion implantation energy than the ion implantation energy of the second body ion implantation region 270.

Figure 11B:
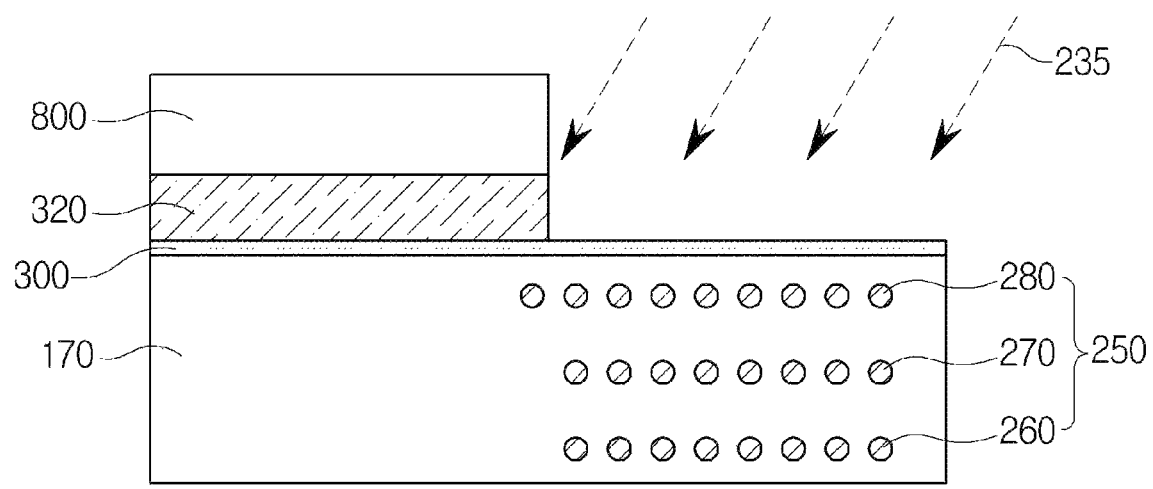

Furthermore, referring to the example of FIG. 11B, a gate electrode 320 is formed by patterning the polysilicon layer. Also, tilt ion implantation 235 is performed using the gate electrode 320 as a mask. In such an example, the third body ion implantation region 280 is formed on the surface of the N-drift region 170. Thus, a P-type impurity may be implanted into a lower portion of the gate electrode 320 through the tilt ion implantation, and the lateral length of the third body ion implantation region 280 formed through the tilt ion implantation may accordingly be longer than the lateral length of the first and second body ion implantation regions 260 and 270. Such first to third body ion implantation processes are performed to complete a P-body region 250 for forming a channel. Because the P-body region 250 is formed in a self-aligned manner with respect to the gate electrode 320, dispersion of a threshold voltage and a breakdown voltage is reduced accordingly. This effect occurs because overlay dispersion of a photolithography process is reduced through such a technique. Furthermore, a reason why the P-type body region 250 is formed by changing the ion implantation energy several times is to uniformly distribute the concentration of the P-type body region 250. If the concentration becomes uniform, it is advantageous to thereby accordingly securing the switching speed of the semiconductor device.

Figure 11C:
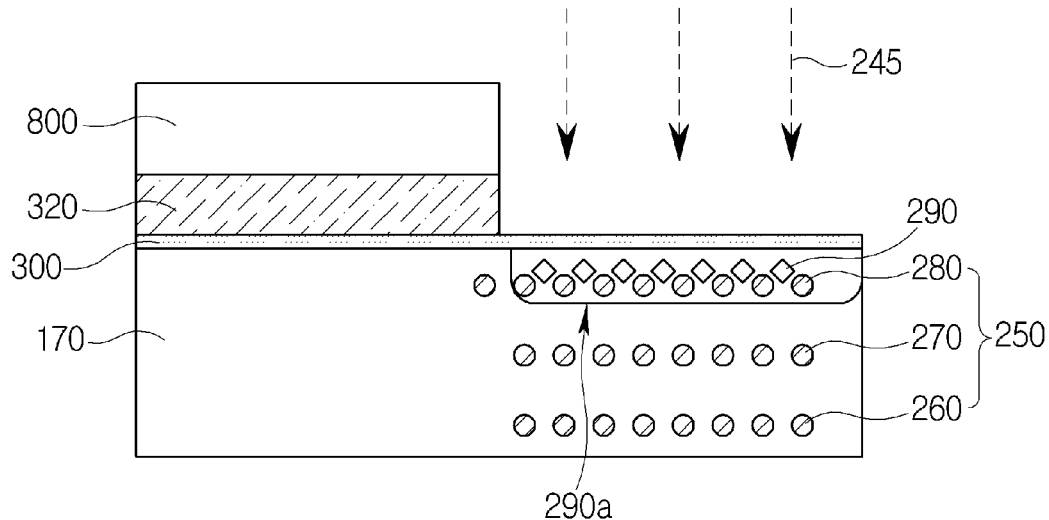

Referring to the example of FIG. 11C, ion implantation 245 is performed using an N-type dopant to form an N-LDD region 290 on the P-body region 250. The ion implantation 245 is performed before a spacer 400 is formed. The N-LDD region 290 is formed so as to overlap the gate electrode 320.

Figure 11D:
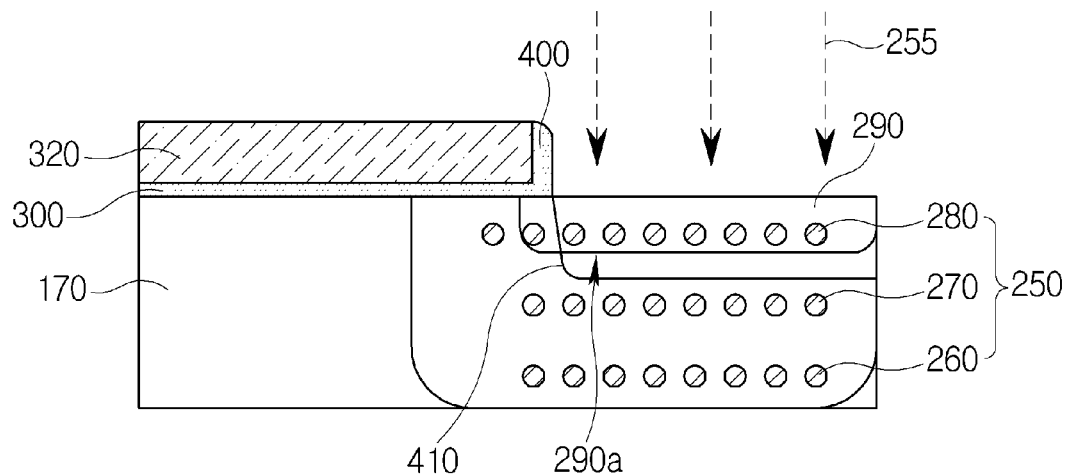

Referring to the example of FIG. 11D, the spacer 400 is formed on the side surface of the gate electrode 320, and ion implantation 255 is performed in order to form an N+ source region 410. The source region 410 is formed in alignment with the spacer 400. The source region 410 is formed in order to overlap the N-LDD region 290.

FIGS. 12A to 12D are views illustrating a method for forming a semiconductor device according to another example.

Figure 12A:
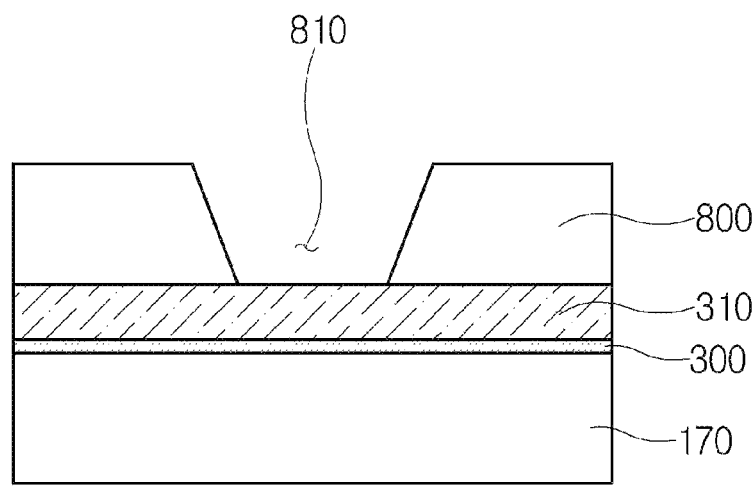
FIGS. 12A to 12D are views illustrating a method for forming a semiconductor device according to another example.
Figure 12B:
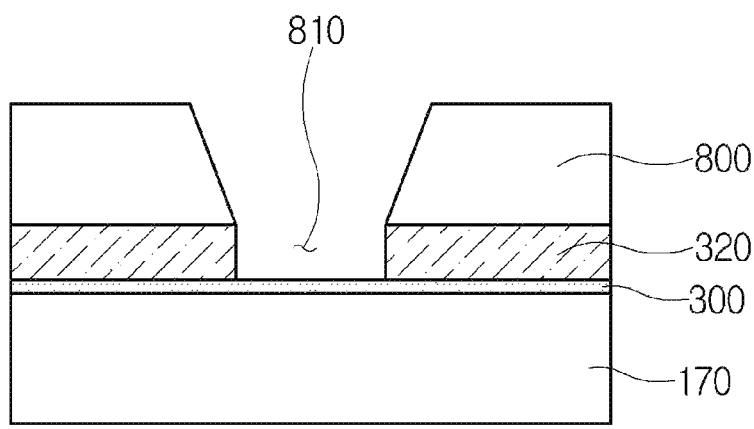

Referring to the example of FIG. 12A, a P-body mask pattern 800 is formed in a state where a polysilicon layer 310 has been formed. In such an example, an opening 810 may be formed on the P-body mask pattern 800 to expose a part of the polysilicon layer 310. Referring to the example of FIG. 12B, a gate electrode 320 is formed by etching the polysilicon 310 using the P-body mask pattern 800. The gate electrode 320 may be separated into two parts, and an N-drift region 170 may be exposed between the two gate electrodes 320.

Figure 12C:
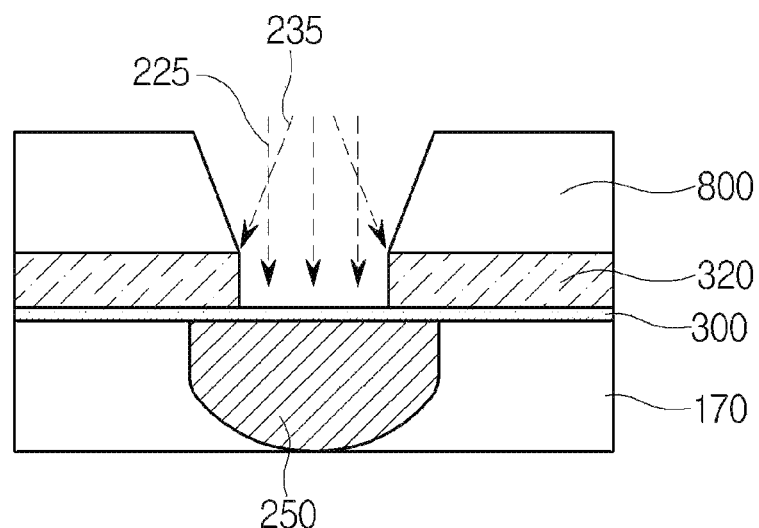

Referring to the example of FIG. 12C, a P-body region 250 is formed by successively performing first to third body ion implantations 225 and 235 into the N-drift region 170 with a P-type dopant, using the gate electrodes 320 as a mask. Here, the third body ion implantation is performed using a tilted ion implantation 235.

Figure 12D:
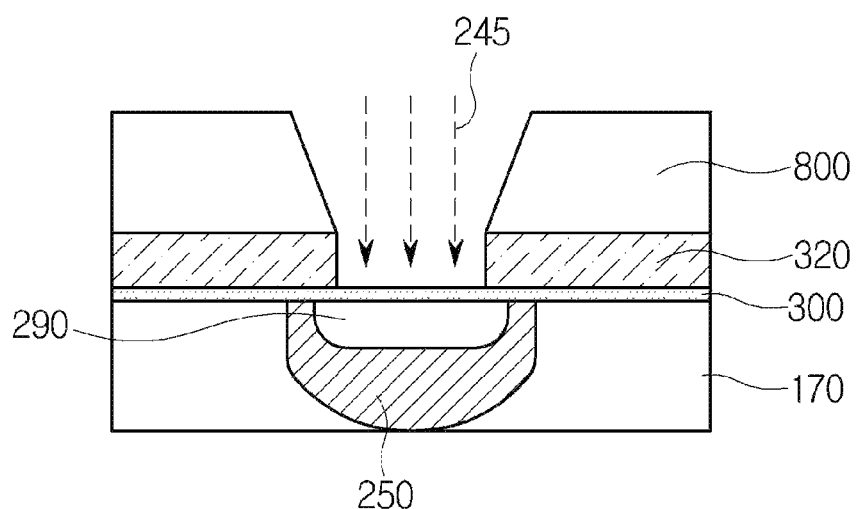

Referring to the example of FIG. 12D, ion implantation 245 is continuously performed using an N-type dopant in a state where the P-body mask pattern 800 exists. Accordingly, an N-LDD region 290 is formed. The remaining stage, that is, forming of a spacer and source/drain regions, is the same as that as described above with reference to the examples of FIGS. 2 to 10 and 11A to 11D.

According to the n-LDMOS device according to the examples, the P-body region is formed using the gate electrode as a mask, and thus dispersions of the breakdown voltage and the threshold voltage become uniform with respect to one another. Furthermore, it is possible to form the n-LDMOS device to have high breakdown voltage through forming of the PBL layer as discussed further, above.

With respect to the n-LDMOS device according to the examples, the channel length may be adjusted by controlling the tilted angle at which the P-type impurity is implanted and the concentration of the P-type impurity. Accordingly, the body region 250 may be formed to implement the channel length that is appropriate for the size of the semiconductor device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a semiconductor device, comprising:
   forming a gate insulation film and a polysilicon layer on a substrate;
   forming a polysilicon pattern by etching the polysilicon layer;
   forming a mask pattern on the polysilicon pattern to expose a portion of the polysilicon pattern;
   performing a first ion implantation process that implants dopants that pass through the exposed polysilicon pattern to form a first body ion implantation region;
   forming a gate electrode by etching the exposed polysilicon pattern;
   forming a spacer on a side surface of the gate electrode; and
   forming an N-type source region on a side surface of the spacer.

2. The method of claim 1, further comprising a secondary ion implantation process onto the substrate using the gate electrode as a mask to form a second body ion implantation region, wherein a P-type body region comprises the first and second body ion implantation regions.

3. The method of claim 2, wherein the second body ion implantation region is formed by tilted ion implantation.

4. The method of claim 2, wherein the P-type body region is formed to overlap with the gate electrode.

5. The method of claim 2, wherein the P-type body region has a longer width as it becomes closer to a top surface of the substrate.

6. The method of claim 2, wherein the first body ion implantation region has a depth deeper than a depth of the second body ion implantation region.

7. The method of claim 2, wherein the N-type source region is formed in the P-type body region.

8. The method of claim 1, wherein the forming the gate electrode comprises forming a first gate electrode and a second gate electrode spaced apart from each other.

9. The method of claim 1, further comprising:
   forming an N-type buried layer, a P-type buried layer, and an N-type drift region in the substrate;
   forming a P-type well region connected to the P-type buried layer; and
   forming an N-type well region connected to the N-type buried layer.

10. The method of claim 9, wherein the N-type buried layer has a length that is greater than a length of the P-type buried layer.

11. The method of claim 9, wherein the first body ion implantation region is in direct contact with the P-type buried layer.

12. The method of claim 1, wherein the gate electrode is formed of polysilicon, tungsten (W), tungsten nitride (WN), titanium (Ti), molybdenum (Mo), cobalt (Co), nickel (Ni), copper (Cu), or aluminum (Al).

13. The method of claim 1, wherein the gate insulation film is formed of any one or any combination of any two or more of silicon oxide film ($SiO_2$) or a silicon nitride film (SiN), a silicon oxide nitride film (SiON), and a high-k material film.

14. The method of claim 13, wherein the high-k material film comprises any one or any combination of any two or more of aluminum oxide ($Al_2O_3$), tantalum oxide ($Ta_2O_5$), and hafnium oxide ($HfO_2$).

15. A method for manufacturing a semiconductor device, comprising:
   forming a gate insulation film and a polysilicon layer on a substrate;
   forming a mask pattern on the polysilicon layer;
   performing a first ion implantation process, using a P-type dopant, onto the substrate, that implants the P-type dopant that passes through the polysilicon layer;
   forming a gate electrode by etching the polysilicon layer using the mask pattern;
   forming a P-type body region in the substrate that overlaps the gate electrode by performing secondary ion implantation onto the substrate, using the gate electrode as a mask;
   forming an N-type LDD region in the P-type body region, using the gate electrode as a mask;
   forming a spacer on the gate electrode; and
   forming an N-type source region in the P-type body region.

16. The method of claim 15, further comprising forming an N-type drain region spaced apart from the gate electrode.

17. The method of claim 15, further comprising forming a P-type buried layer that contacts the P-type body region before forming the gate insulation film and the polysilicon layer on the substrate.

18. A semiconductor device comprising:
   a first conductivity type buried layer formed on a substrate;
   a second conductivity type buried layer formed on the first conductivity type buried layer and having a width that is less than a width of the first conductivity type buried layer;
   first conductivity type first and second drift regions formed on the second conductivity type buried layer;
   first and second gate electrodes formed on the first and second drift regions, respectively;
   a second conductivity type body region disposed between the first and second drift regions and connected to the second conductivity type buried layer; and
   a first conductivity type source region disposed between the first and second drift regions and formed on the second conductivity type body region.

19. The semiconductor device of claim 18, further comprising first and second drain regions of the first conductivity type formed spaced apart from the first and second gate electrode, respectively.

20. The semiconductor device of claim 18, wherein the body region comprises a plurality of body ion implantation regions having different depths.

* * * * *